United States Patent
Sim et al.

(10) Patent No.: US 9,899,985 B2
(45) Date of Patent: Feb. 20, 2018

(54) COMMON MODE FILTER

(71) Applicant: SAMSUNG ELECTRO-MECHANICS CO., LTD., Suwon-Si, Gyeongi-Do (KR)

(72) Inventors: Won Chul Sim, Suwon-Si (KR); Young Ghyu Ahn, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 126 days.

(21) Appl. No.: 14/931,619

(22) Filed: Nov. 3, 2015

(65) Prior Publication Data
US 2016/0276999 A1  Sep. 22, 2016

(30) Foreign Application Priority Data

Mar. 18, 2015 (KR) .................. 10-2015-0037455

(51) Int. Cl.
H03H 7/09 (2006.01)
H03H 7/42 (2006.01)
H01F 27/28 (2006.01)
H03H 7/01 (2006.01)
H03H 1/00 (2006.01)

(52) U.S. Cl.
CPC ......... *H03H 7/427* (2013.01); *H01F 27/2823* (2013.01); *H03H 7/0115* (2013.01); *H03H 7/09* (2013.01); *H03H 2001/0021* (2013.01); *H03H 2001/0085* (2013.01); *H03H 2001/0092* (2013.01)

(58) Field of Classification Search
CPC ........ H03H 7/09; H03H 7/0115; H03H 7/427; H03H 2001/0085

USPC .......................... 333/168, 175, 185; 336/200
See application file for complete search history.

(56) References Cited

U.S. PATENT DOCUMENTS

| 4,667,173 A * | 5/1987 | Okochi ................ H03H 1/0007 333/168 |
| 5,808,527 A * | 9/1998 | De Los Santos ....... H01P 1/127 333/205 |
| 2007/0001782 A1 | 1/2007 | Sasaki et al. |
| 2014/0145796 A1* | 5/2014 | Okumura ................. H03H 7/09 333/177 |
| 2014/0266504 A1* | 9/2014 | Tai ........................ H03H 7/427 333/168 |

(Continued)

FOREIGN PATENT DOCUMENTS

| JP | 2007-181169 A | 7/2007 |
| JP | 2010-177380 A | 8/2010 |
| JP | 2012-195332 A | 10/2012 |

(Continued)

OTHER PUBLICATIONS

Korean Office Action dated Mar. 10, 2016 issued in Korean patent application No. 10-2015-0037455. (w/ English ranslation).

*Primary Examiner* — Rakesh Patel
(74) *Attorney, Agent, or Firm* — McDermott Will & Emery LLP

(57) ABSTRACT

A common mode filter includes a first filter and a second filter formed by a magnetic coupling between primary coils and secondary coils, respectively, and connected in series. In the common mode filter, a resonance frequency f1 of the first filter and a resonance frequency f2 of the second filter are different from each other.

12 Claims, 11 Drawing Sheets

(56) References Cited

U.S. PATENT DOCUMENTS

2014/0368307 A1* 12/2014 Kato .................. H01F 17/0013
                                                         336/200
2015/0214915 A1*  7/2015 Yosui ..................... H03H 7/427
                                                         333/181

FOREIGN PATENT DOCUMENTS

JP      2014-120543 A    6/2014
KR   10-2006-0103273 A   9/2006

* cited by examiner

COMMON MODE FILTER

CROSS-REFERENCE TO RELATED APPLICATION

This application claims the benefit of priority to Korean Patent Application No. 10-2015-0037455 filed on Mar. 18, 2015, with the Korean Intellectual Property Office, the disclosure of which is incorporated herein by reference.

BACKGROUND

The present disclosure relates to a common mode filter, and more particularly, to a common mode filter able to remove wideband noise.

In accordance with technological developments, electronic devices such as mobile phones, home appliances, personal computers (PCs), personal digital assistants (PDAs), liquid crystal displays (LCDs), and the like, have changed from being analog implemented to being digitally implemented, and electronic device speeds have increased due to an increase in an amount of data processed by the electronic devices.

Therefore, a universal serial bus (USB) 2.0, a USB 3.0, and a high-definition multimedia interface (HDMI) have widely been circulated as high speed signal transmitting interfaces, and have been used in many digital devices such as personal computers and digital high-definition televisions.

These high speed interfaces adopt a differential transmission system transmitting signals having a phase difference of 180 degrees using a pair of signal lines, unlike a single-end transmission system that has been generally used for a long period of time.

In a case in which phases of high frequency signals do not coincide with each other in the above-mentioned differential transmission, common mode noise occurs, and this noise is radiated, thereby influencing peripheral communications elements. As a coil component for filtering common mode noise, a common mode filter has been widely used. That is, common mode noise is noise generated in the differential signal line, and the common mode filter removes noises that may not be removed by an existing filter.

Therefore, the common mode filter may advantageously remove noise across a wideband. However, an existing common mode filter using two coils may merely remove noise of a natural frequency band designed according to a target value, and has a disadvantage in that it does not remove the noise across the wideband.

SUMMARY

An aspect of the present disclosure may provide a common mode filter capable of attenuating noise across a wideband by connecting two filters having different resonance frequencies in series.

According to an aspect of the present disclosure, a common mode filter may include a first filter and a second filter formed by a magnetic coupling between primary coils and secondary coils, respectively, and connected in series. A resonance frequency of the first filter and a resonance frequency of the second filter may be different from each other.

The first filter and the second filter may be disposed side by side, and inductance of the first filter and inductance of the second filter may have values different from each other by setting the number of coil turns of the primary and secondary coils of the first filter and the number of coil turns of the primary and secondary coils of the second filter to be different from each other.

Capacitance of the first filter and capacitance of the second filter may have values different from each other by setting a distance between the primary coil of the first filter and the secondary coil of the first filter to be different from a distance between the primary coil of the second filter and the secondary coil of the second filter.

According to another aspect of the present disclosure, a common mode filter may include a primary coil of a first filter and a primary coil of a second filter disposed side by side and connected in series, and a secondary coil of the first filter and a secondary coil of the second filter disposed side by side, connected in series, and disposed to face the primary coils of the first and second filters, respectively. The primary and secondary coils of the first and second filters may be configured of a plurality of layers, and coils having the same order may be interconnected through vias.

The primary coil of the first filter and the primary coil of the second filter disposed on the same plane may be connected in series by a first connection pattern extended from outer end portions of the respective primary coils, and the secondary coil of the first filter and the secondary coil of the second filter disposed on the same plane may be connected in series by a second connection pattern extended from outer end portions of the respective secondary coils.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
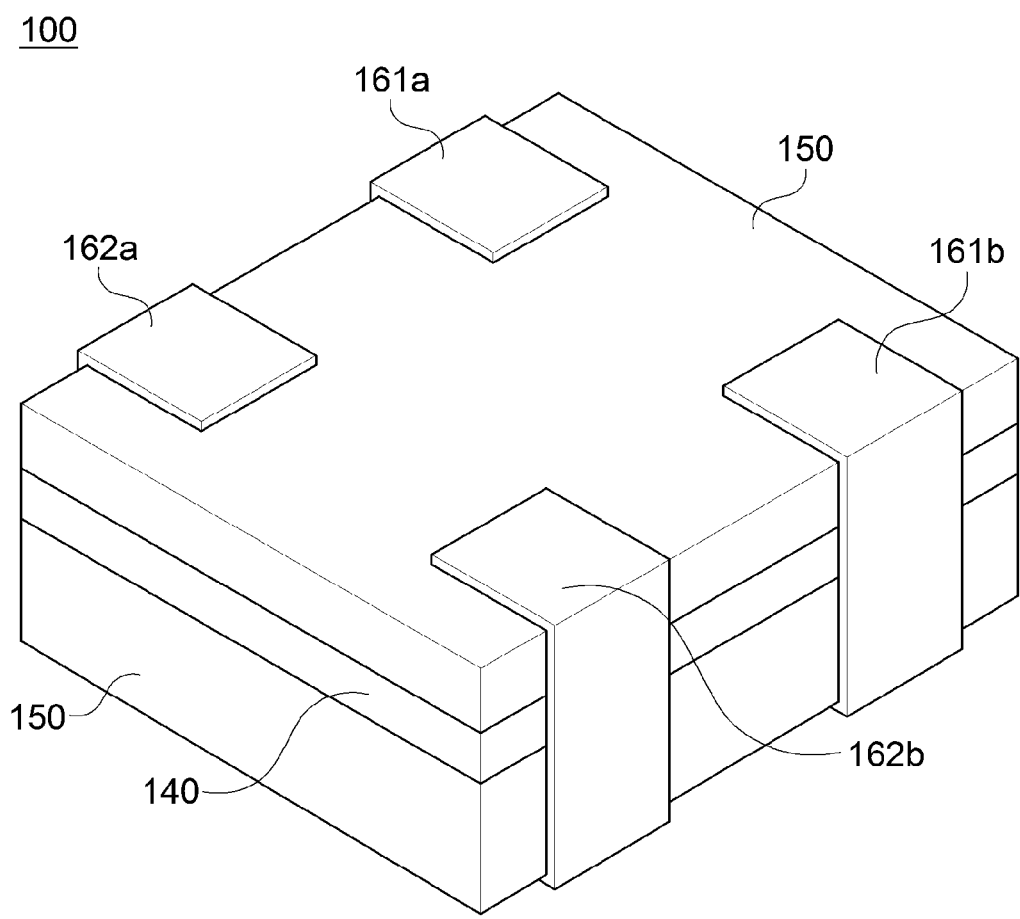
FIG. 1 is an external perspective view of a common mode filter according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
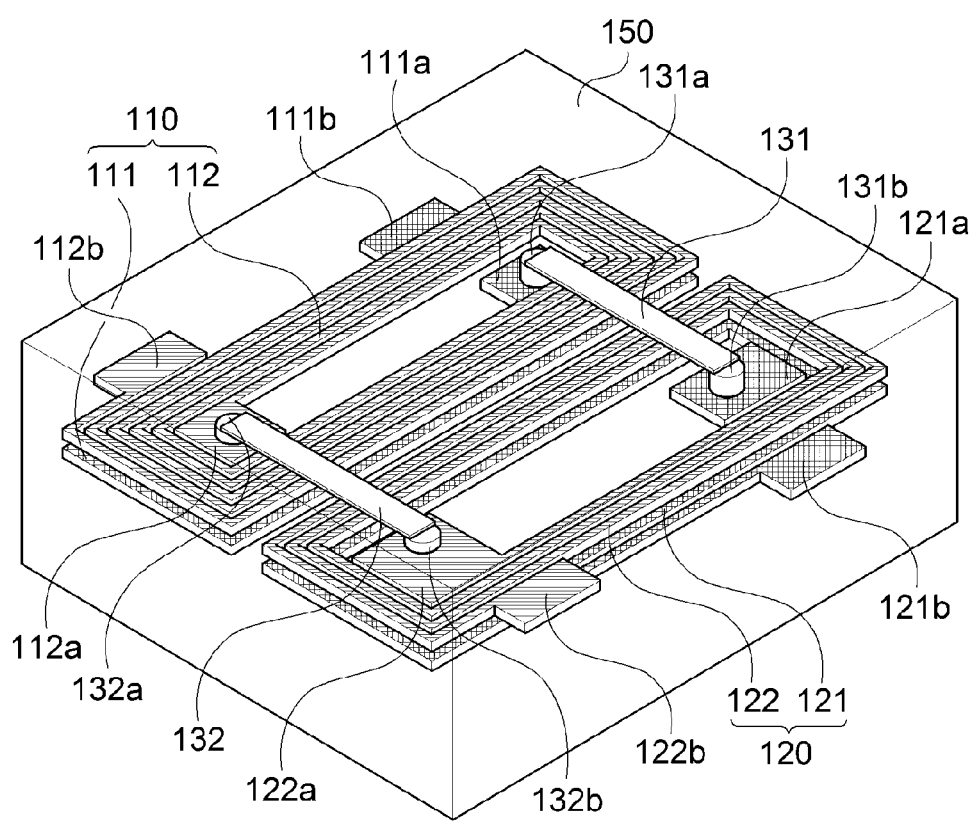
FIG. 2 is an internal perspective view of FIG. 1.
Figure 3:
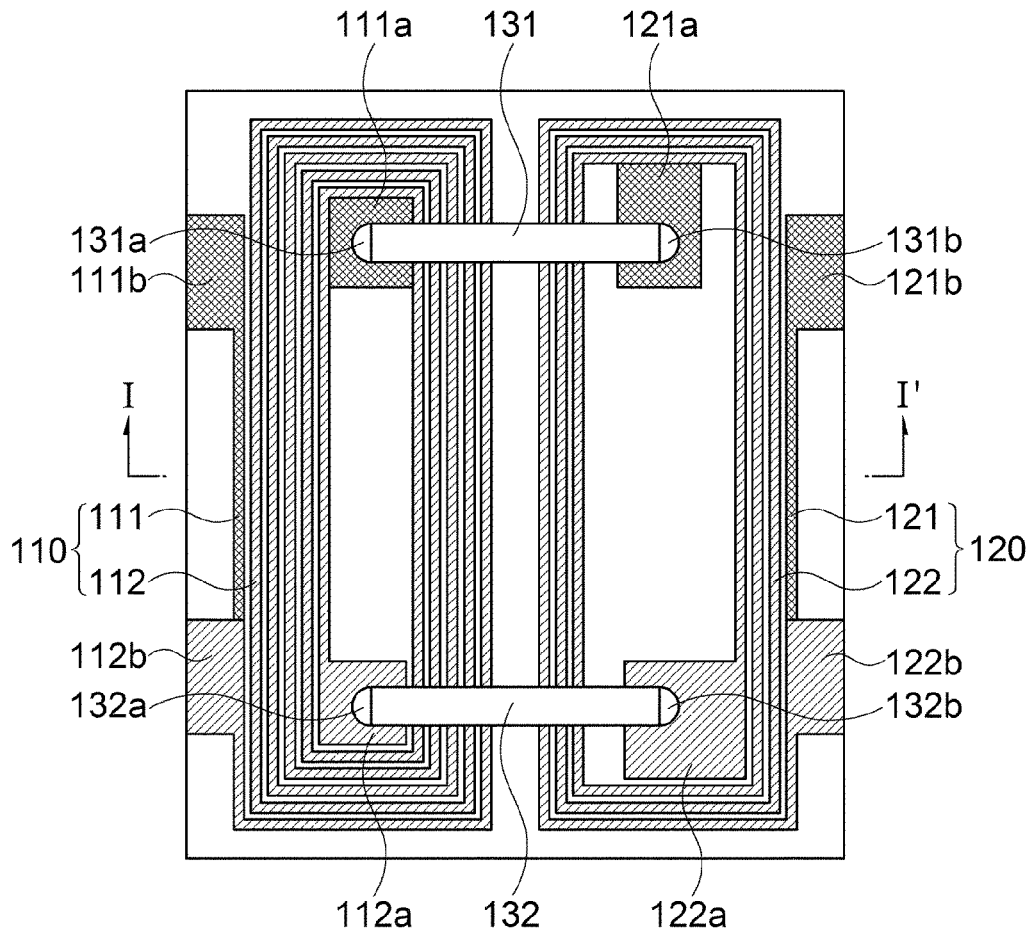
FIG. 3 is a plan view of FIG. 2.
Figure 4:
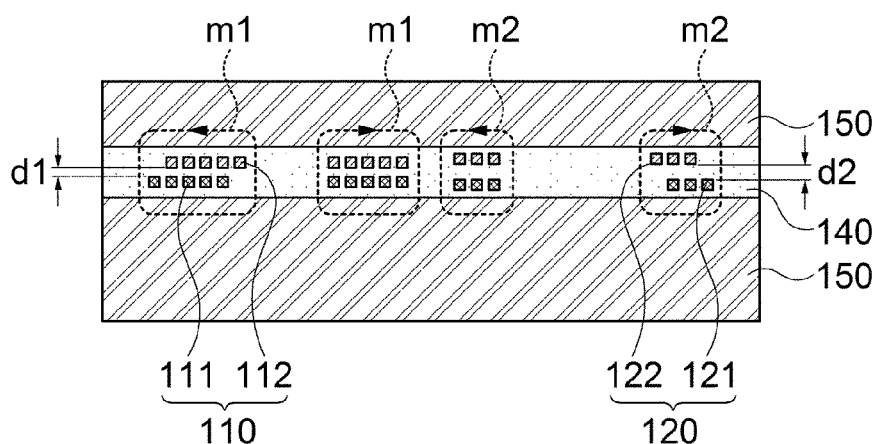
FIG. 4 is a cross-sectional view taken along line I-I' of FIG. 3.

FIG. 1 is an external perspective view of a common mode filter according to an exemplary embodiment, FIG. 2 is a perspective view of FIG. 1, FIG. 3 is a plan view of FIG. 2, and FIG. 4 is a cross-sectional view taken along line I-I' of FIG. 3.

Referring to FIGS. 1 through 4, a common mode filter 100, according to an exemplary embodiment, may include a first filter 110 and a second filter 120 connected in series.

The first filter 110 and the second filter 120, which are filters each removing common mode noise of a specific frequency band, may each be configured of primary coils 111 and 121 and secondary coils 112 and 122 which are magnetically coupled to each other. That is, the first filter 110 may be configured of the primary coil 111 and the secondary coil 112 which are magnetically coupled to each other, and the second filter 120 may be configured of the primary coil 121 and the secondary coil 122 which are also magnetically coupled to each other.

The primary and secondary coils 111, 121, 112, and 122 of the respective filters are metal wires formed in a spiral shape on a plane, and for symmetry, the primary and secondary coils 111 and 112 of the first filter 110 may be formed to have the same number of turns, and the primary and secondary coils 121 and 122 of the second filter 120 may also be formed to have the same number of turns.

The primary coils 111 and 121 and the secondary coils 112 and 122 of the respective filters may be disposed to face each other while having a predetermined distance formed therebetween. As a result, according to the exemplary embodiment, inductance L proportional to the number of coil turns and capacitance C generated by stray capacitance may be resonated in parallel to each other and may be operated as the common mode filter attenuating common mode noise.

Figure 5:
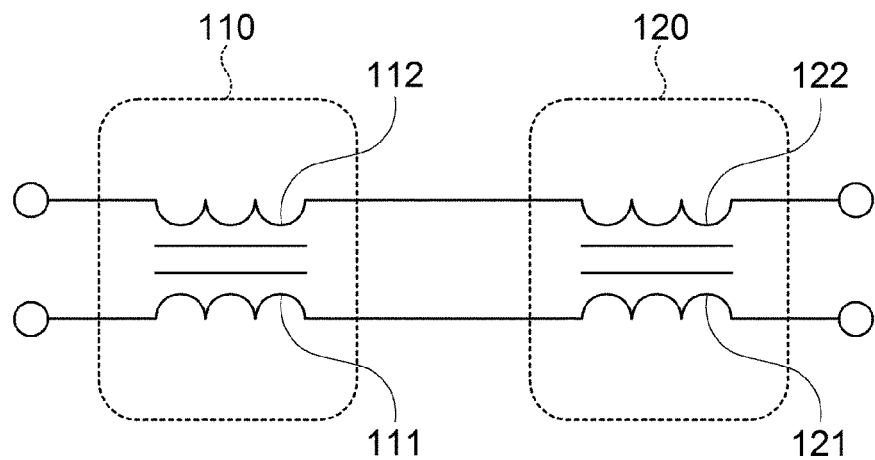
FIG. 5 is an equivalent circuit diagram of the present disclosure.

The primary coil 111 of the first filter 110 and the primary coil 121 of the second filter 120 may be connected in series by a physical connection means, and the secondary coil 112 of the first filter 110 and the secondary coil 122 of the second filter 120 may also be connected in series by a physical connection means. Thus, as in an equivalent circuit according to the exemplary embodiment illustrated in FIG. 5 and an LC resonance circuit according to the exemplary embodiment illustrated in FIG. 6, the first filter 110 and the second filter 120 may have a structure in which they are electrically connected in series.

A connection structure of the primary and secondary coils 111, 121, 112, and 122 of the respective filters will be described in more detail. The primary coil 111 of the first filter 110 and the primary coil 121 of the second filter 120 may be formed side by side on a common layer, for example, a first layer, and the secondary coil 112 of the first coil 110 and the secondary coil 122 of the second filter 120 may also be formed side by side on a common layer, for example, a second layer. Here, the secondary coil 112 of the first filter 110 may be disposed to face the primary coil 111 of the first filter 110, and the secondary coil 122 of the second filter 120 may be disposed to face the primary coil 121 of the second filter 120.

In addition, the primary coil 111 of the first filter 110 and the primary coil 121 of the second filter 120 may be electrically connected to each other by a first connection conductor 131 formed on another layer, for example, a third layer. That is, the first connection conductor 131 may be connected to the primary coil 111 of the first filter 110 through via 131a and connected to the primary coil 121 of the second filter 120 through via 131b.

Here, inner end portions 111a and 121a of the primary coil 111 of the first filter 110 and the primary coil 121 of the second filter 120, respectively, may be connected to the vias 131a and 131b, and outer end portions 111b and 121b of the primary coils 111 and 121, respectively, may be connected to external terminals serving as input and output terminals. For example, the outer end portion 111b of the primary coil 111 may be connected to a first input terminal 161a, and the outer end portion 121b of the primary coil 121 may be connected to a first output terminal 161b.

Through the connection structure described above, a signal input through the first input terminal 161a may be output to the first output terminal 161b through an electrical path from the primary coil 111 of the first filter 110 to the primary coil 121 of the second filter 120 through the via 131a, the first connection conductor 131, and the via 131b.

A series connection between the secondary coil 112 of the first filter 110 and the secondary coil 122 of the second filter 120 may also be implemented by the above-mentioned scheme. For example, the second connection conductor 132 formed on the third layer may be connected to an inner end portion 112a of the secondary coil 112 through via 132a and connected to an inner end portion 122a of the secondary coil 122 through via 132b. Likewise, an outer end portion 112b of the secondary coil 112 may be connected to a second input terminal 162a, and an outer end portion 122b of the secondary coil 122 may be connected to an second output terminal 162b.

Through the connection structure described above, a signal input through the second input terminal 162a may be output to the second output terminal 162b through an electrical path from the secondary coil 112 of the first filter 110 to the secondary coil 122 of the second filter 120 through the via 132a, the second connection conductor 132, and the via 132b.

In the common mode filter 100 according to the exemplary embodiment, since the coils of the same order of the respective filters are disposed side by side, magnetic flux (m1 in FIG. 4) generated around the first filter 110 and magnetic flux (m2 in FIG. 4) generated around the second filter 120 when current is applied may avoid overlapping each other. As a result, a resonance frequency f1 of the first filter 110 and a resonance frequency f2 of the second filter 120 may be separated from each other.

Figure 7:
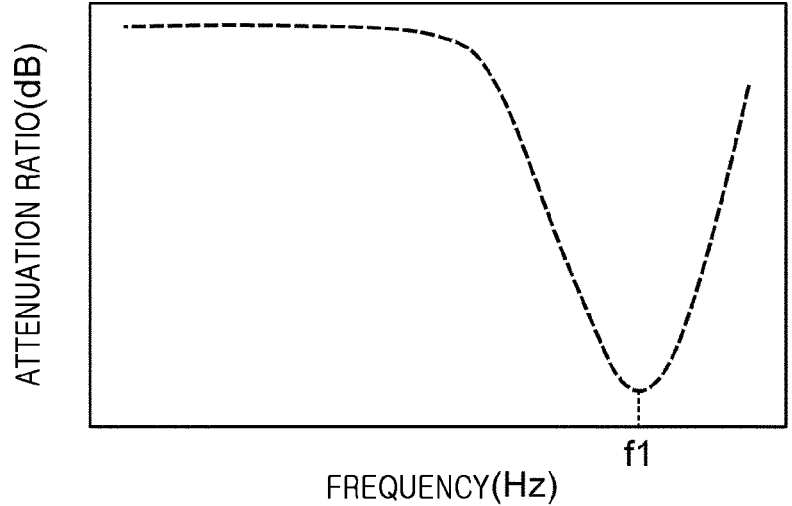
FIG. 7 is a graph illustrating attenuation characteristics of a first filter included in the present disclosure.
Figure 8:
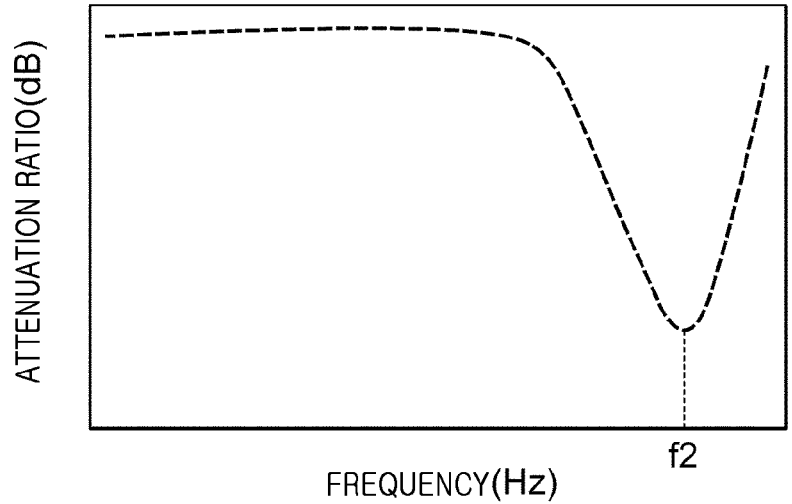
FIG. 8 is a graph illustrating attenuation characteristics of a second filter included in the present disclosure.
Figure 9:
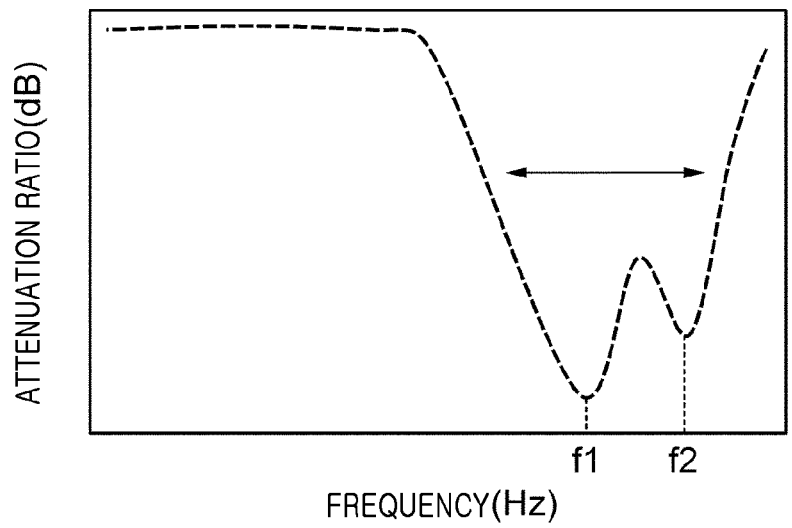
FIG. 9 is a graph illustrating attenuation characteristics caused by a series connection of the first filter and the second filter included in the present disclosure.

FIG. 7 is a graph illustrating attenuation characteristics of the first filter 110, FIG. 8 is a graph illustrating attenuation characteristics of the second filter 120, and FIG. 9 is a graph illustrating attenuation characteristics caused by a series connection of the first filter 110 and the second filter 120.

The separation of the resonance frequency f1 of the first filter 110 and the resonance frequency f2 of the second filter 120 can result in their respective attenuation characteristics shown in FIG. 7 and FIG. 8 are added to each other as illustrated in FIG. 9. Therefore, according to the exemplary embodiment, as illustrated in FIG. 9, both of a notch band of the first filter 110 and a notch band of the second filter 120 may form part of the attenuation characteristics of the series connection. Thus, in a case in which the resonance frequencies of the first filter 110 and the second filter 120, that is, frequencies at which an attenuation ratio becomes greatest, are set to be different from each other, noise may be attenuated across a wide band.

Figure 6:
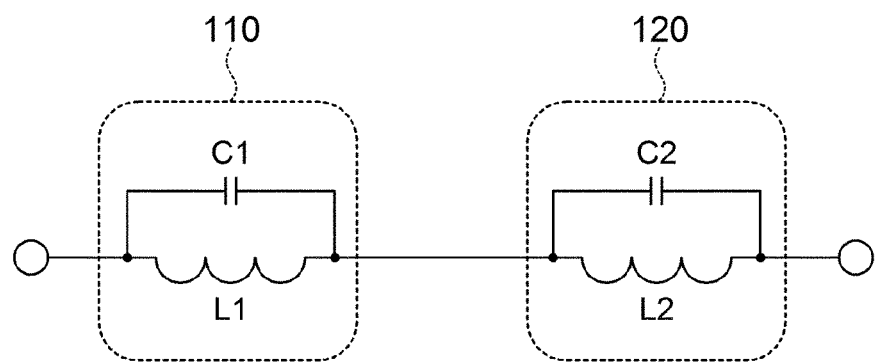
FIG. 6 is an LC resonance circuit diagram of the present disclosure.

The setting of the resonance frequency f1 of the first filter 110 and the resonance frequency f2 of the second filter 120 to be different from each other may be achieved by allowing inductance L1 of the first filter 110 and inductance L2 of the second filter 120 illustrated in FIG. 6 to be different from each other, or by allowing capacitance C1 of the first filter 110 and capacitance C2 of the second filter 120 to be different from each other.

Since the resonance frequency f1 of the first filter 110 is determined by the following Equation 1 and the resonance frequency f2 of the second filter 120 is determined by the following Equation 2, the resonance frequencies of the first filter 110 and the second filter 120 may be set to be different from each other where either or both of conditions L1≠L2 and C1≠C2 are satisfied.

$$f1 = \frac{1}{2\pi\sqrt{L1C1}}$$ [Equation 1]

$$f2 = \frac{1}{2\pi\sqrt{L2C2}}$$ [Equation 2]

The inductances of the respective filters may be adjusted by varying the number of coil turns of the primary and secondary coils 111, 121, 112, and 122 included in the respective filters. For example, as illustrated in FIG. 3, in a case in which the primary and secondary coils 111 and 112 of the first filter 110 have 5 turns and the primary and secondary coils 121 and 122 of the second filter 120 have 3 turns, the inductance L1 of the first filter 110 and the inductance L2 of the second filter 120 may have values different from each other. As a result, the resonance frequency f1 of the first filter 110 may be different from the resonance frequency f2 of the second filter 120.

In addition, the capacitances of the respective filters may be adjusted by varying distances between the primary coils 111 and 121 and the secondary coils 112 and 122 included in the respective filters. The stray capacitance is in inverse proportion to a distance between two metals. Therefore, as illustrated in FIG. 4, in a case in which a distance d1 between the primary coil 111 and the secondary coil 112 of the first filter 110, and a distance d2 between the primary coil 121 and the secondary coil 122 of the second filter 120 are different from each other, the capacitance C1 of the first filter 110 and the capacitance C2 of the second filter 120 may have values different from each other. As a result, the resonance frequency f1 of the first filter 110 and the resonance frequency f2 of the second filter 120 may be set to be different from each other.

Although only an internal structure has been described for convenience of explanation, the primary and secondary coils 111, 121, 112, and 122 of the first and second filters 110 and 120, and the first and second connection conductors 131 and 132 may have a shape enclosed by an insulating layer 140 made of a polymer material such as an epoxy resin, a phenol resin, a urethane resin, a silicon resin, a polyimide resin, or the like, in order to secure insulation properties between the wires and protect the wires from external factors such as humidity, heat, or the like.

More specifically, a first insulating layer, a base layer, may be coated on a bottom surface, and the primary coil 111 of the first filter 110 and the primary coil 121 of the second filter 120 may be formed side by side over the bottom surface coated with the first insulating layer. A second insulating layer may be coated to cover the primary coil 111 of the first filter 110 and the primary coil 121 of the second filter 120. The secondary coil 112 of the first filter 110 and the secondary coil 122 of the second filter 120 may be formed over the second insulating layer to face the primary coil 111 of the first filter 110 and the primary coil 121 of the second filter 120, respectively. A third insulating layer may be formed to cover the second coils 112 and 122, the first and second connection conductors 131 and 132 may be formed over the third insulating layer at appropriate positions. The insulating layers of the respective layers laminated as described above may be compressed and sintered under a predetermined condition.

In order to secure high permeability, magnetic members 150, which are movement paths of magnetic flux, may be formed on upper and lower portions of the insulating layer 140. As a result, the magnetic fluxes generated around the first and second filters 110 and 120 when current is applied may form a closed magnetic path via the upper and lower magnetic members 150, thereby implementing high permeability.

Any magnetic material may be used to form the magnetic members 150, including an Ni-based ferrite, an Ni—Zn-based ferrite, an Ni—Zn—Cu ferrite, or the like, as long as it may obtain predetermined inductance. In order to increase permeability and mechanical strength, the magnetic members 150 may also be formed in a magnetic-resin composition form having excellent impact resistance by sintering magnetic powder of the above-mentioned material under a predetermined condition, or immersing a fluidic resin in the magnetic powder.

The common mode filter 100, according to the exemplary embodiment, may be implemented as a laminator having the magnetic members 150 laminated on the upper and lower portions of the insulating layer 140 as a basic configuration. The first and second input and output terminals 161a, 161b, 162a, and 162b may be installed to be connected to the outer end portions 111b, 121b, 112b, and 122b of the respective coils exposed to end surfaces of the laminator.

Hereinafter, a common mode filter according to another exemplary embodiment will be described.

Figure 10:
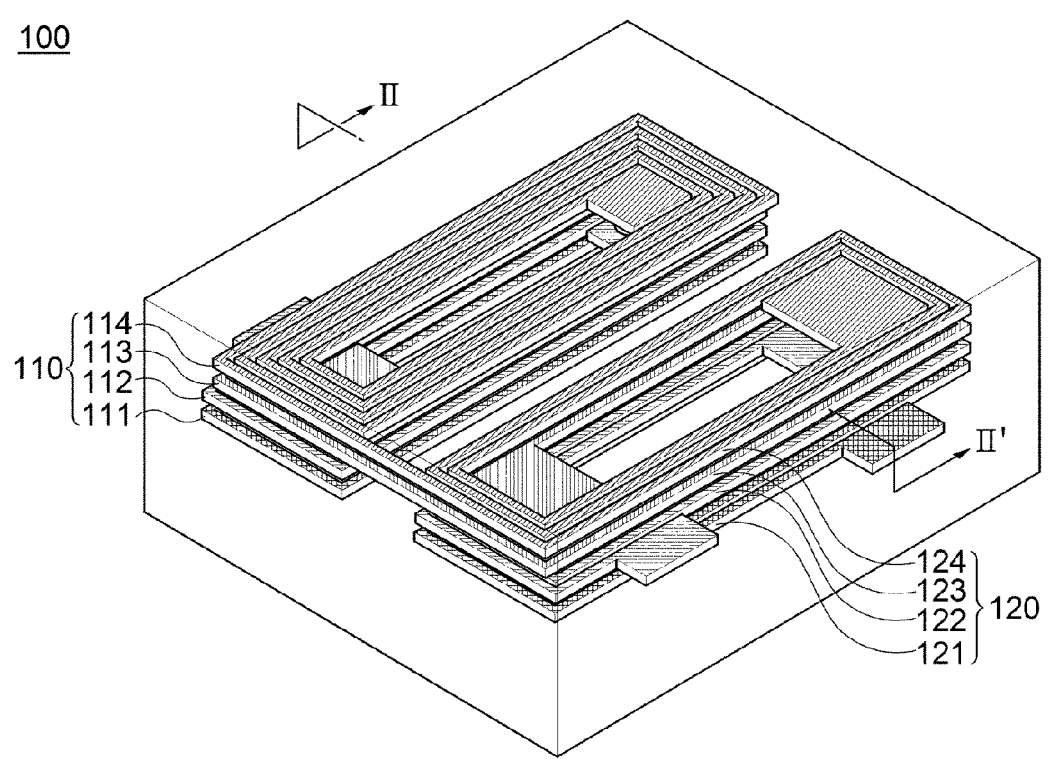
FIG. 10 is a perspective view of a common mode filter according to another exemplary embodiment in the present disclosure.
Figure 11:
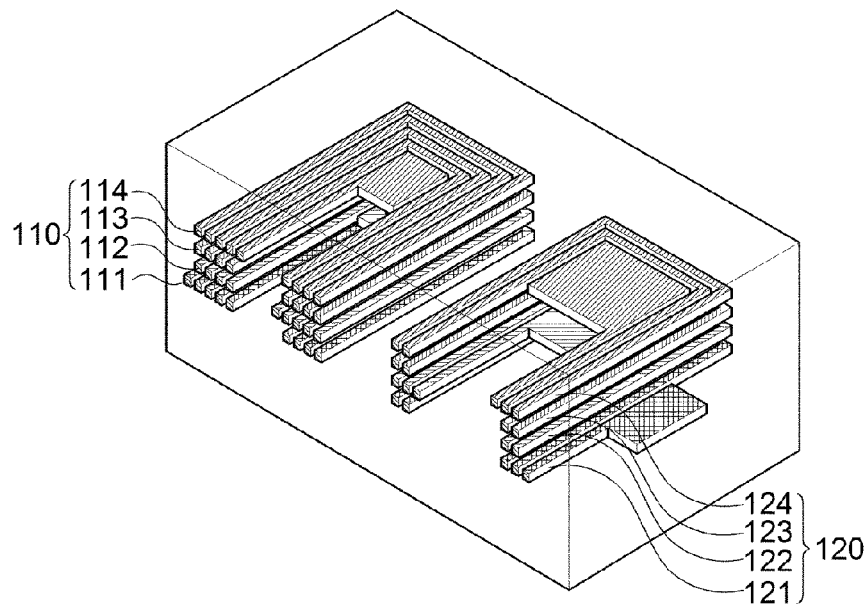
FIG. 11 is a cross-sectional view taken along line II-II' of FIG. 10.

FIG. 10 is a perspective view of a common mode filter according to another exemplary embodiment, and FIG. 11 is a cross-sectional view taken along line II-II' of FIG. 10.

Referring to FIGS. 10 and 11, according to the present exemplary embodiment, the primary and secondary coils included in the respective filters may be configured of a plurality of layers. That is, in the first filter 110, the primary coil, may be configured of the primary coil 111 disposed on the first layer and the primary coil 113 disposed on the third layer, and the secondary coil may be configured of the secondary coil 112 disposed on the second layer and a secondary coil 124 disposed on a fourth layer. Likewise, in the second filter 120, the primary coil may be configured of the primary coil 121 disposed on the first layer and the primary coil 123 disposed on the third layer, and the secondary coil may be configured of the secondary coil 122 disposed on the second layer and the secondary coil 124 disposed on the fourth layer.

As such, according to the exemplary embodiment, the coils 111 to 114 and 121 to 124 configuring the respective filters may be configured of the plurality of layers, wherein the primary coils 111,113,121, and 123 and the secondary coils 112,114,122, and 124 on the respective layers may be alternately disposed, and the coils having the same order may be interconnected to each other through vias.

For a clearer understanding, a description will be provided with reference to FIGS. 12 through 17 in which the coils of the respective layers are illustrated for each layer.

Figure 12:
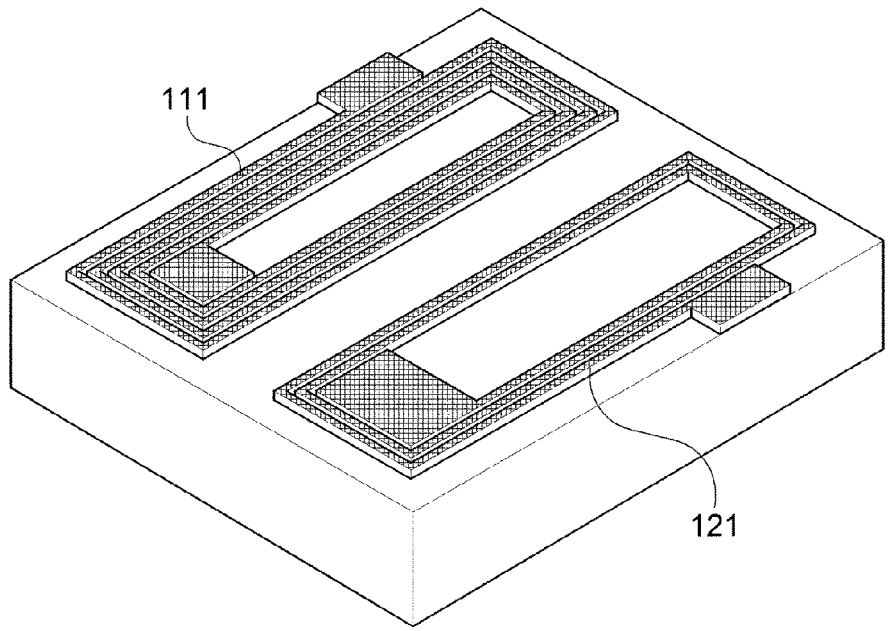
FIGS. 12 through 17 are perspective views illustrating coils of the respective layers included in the present disclosure on each layer.
Figure 13:
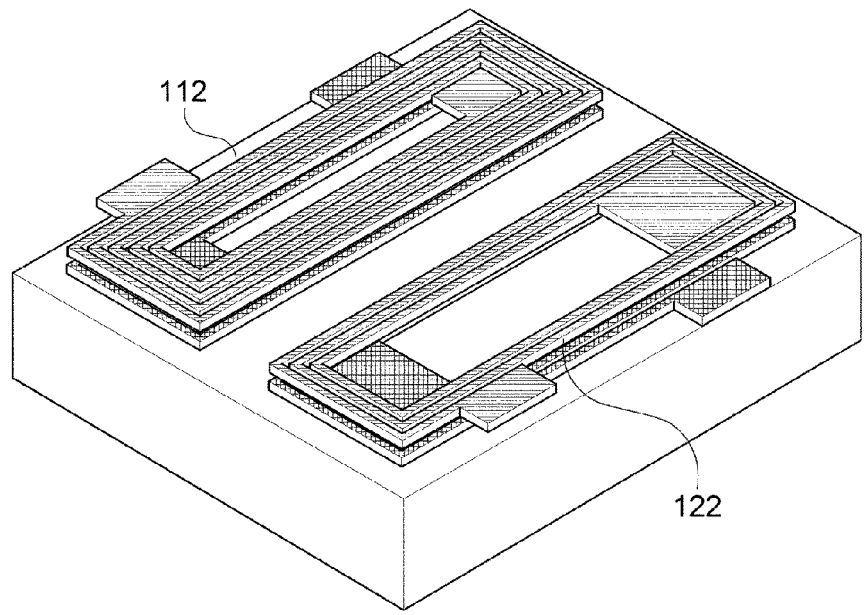

As shown in FIG. 12, the primary coil 111 of the first filter 110 and the primary coil 121 of the second filter 120 may be formed side by side on the first layer. The secondary coil 112 of the first filter 110 and the secondary coil 122 of the second filter 120 may be formed on the second layer to face the primary coils 111 and 121 as shown in FIG. 13. The intervening insulating layers 140 are omitted from FIGS. 12-19 for convenience of explanation.

Figure 14:
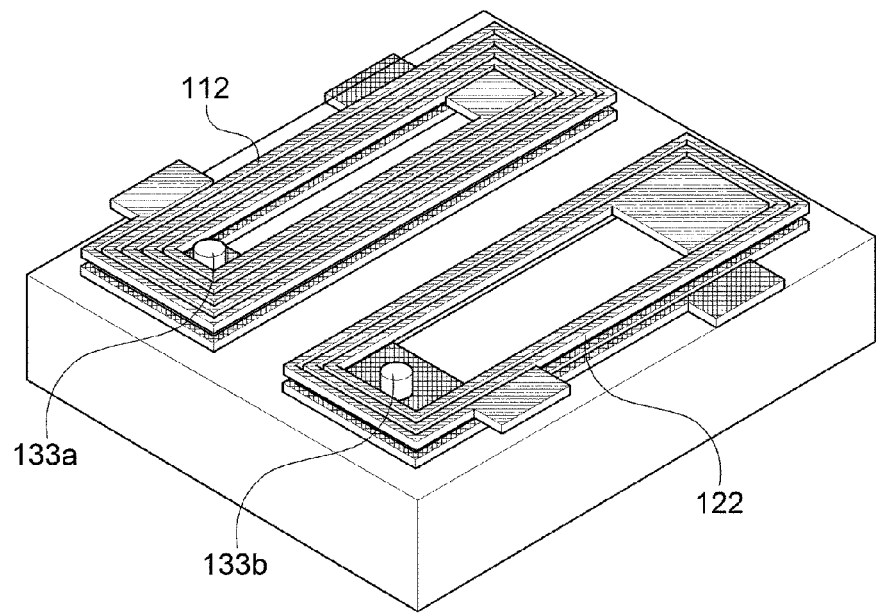
Figure 15:
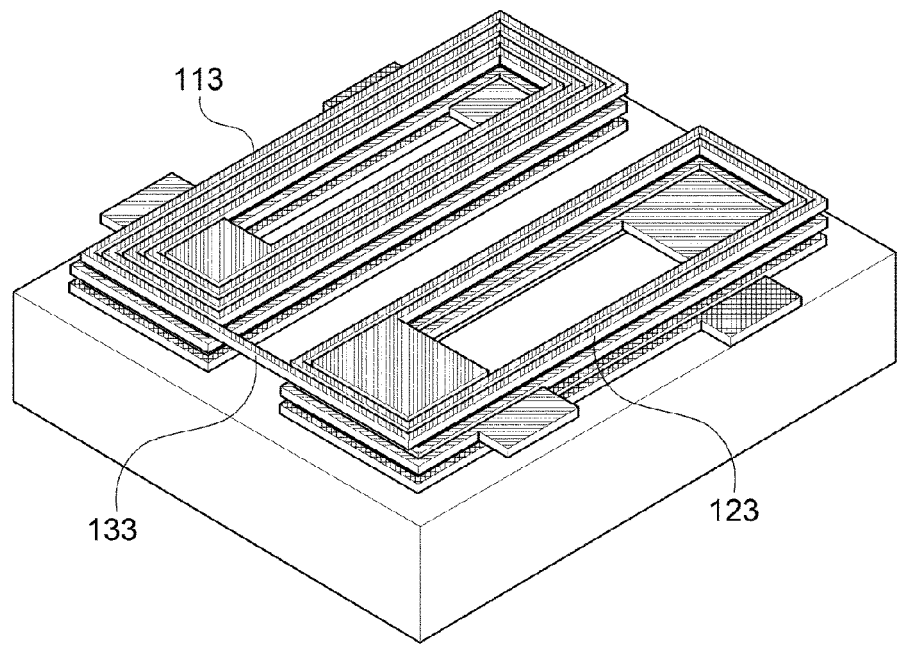

As shown in FIG. 14, vias 133a and 133b for connection between the layers may be formed at positions corresponding to the inner end portions of the primary coils 111 and 121, respectively. The vias 133a and 133b may be connected to the primary coils 113 and 123 of the respective filters penetrating through the second layer to be formed on the third layer, as shown in FIG. 15. That is, the primary coil 111 of the first filter 110 formed on the first layer may be connected to the primary coil 113 of the first filter 110 formed on the third layer through the via 133a, and the primary coil 121 of the second filter 120 formed on the first layer may be connected to the primary coil 123 of the second filter 120 formed on the third layer through the via 133b.

Figure 16:
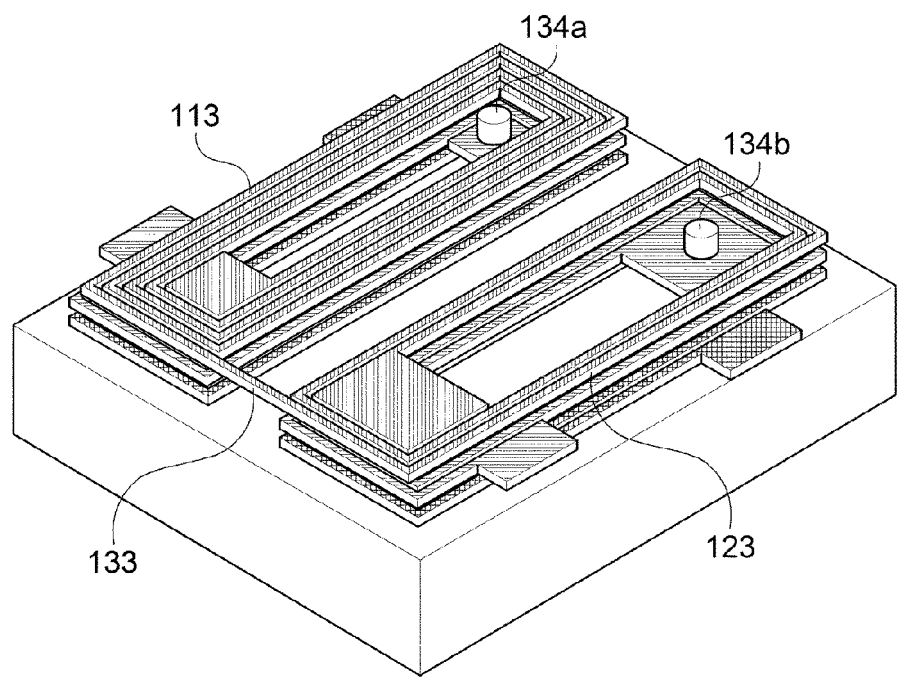
Figure 17:
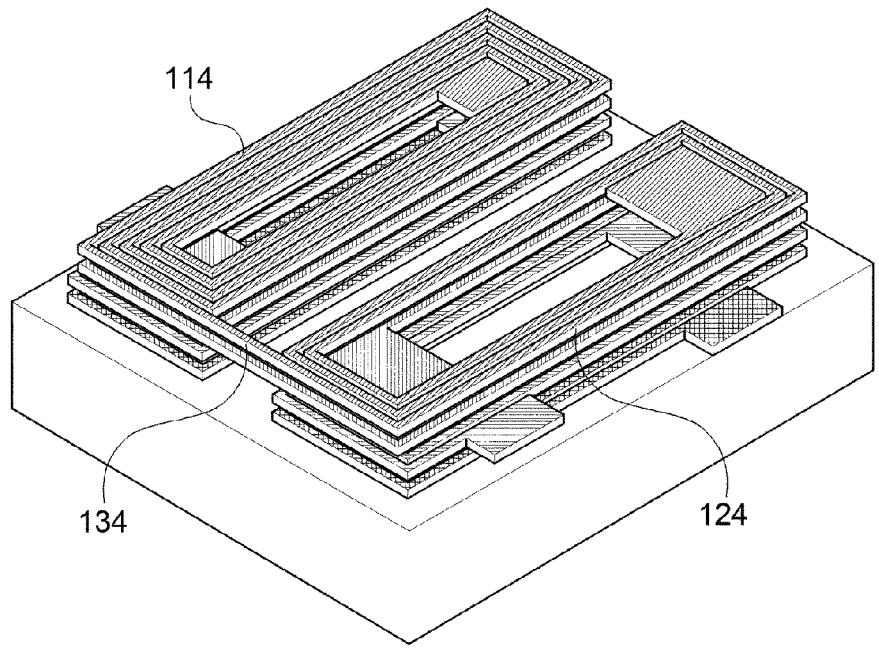

As shown in FIG. 16, vias 134a and 134b connected to the inner end portions of the secondary coils 112 and 122, respectively, formed on the second layer may be formed to penetrate through the third layer. Thus, as shown in FIG. 17, the secondary coil 114 of the first filter 110 formed on the fourth layer may be connected to the secondary coil 112 of the first filter 110 formed on the second layer through the via 134a, and the secondary coil 124 of the second filter 120 formed on the fourth layer may be connected to the secondary coil 122 of the second filter 120 formed on the second layer through the via 134b.

According to the present exemplary embodiment, the first filter 110 and the second filter 120 may be connected in series by a physical connection between the coils having the same order formed on the same plane. For example, the primary coil 113 of the first filter 110 and the primary coil 123 of the second filter 120 formed on the third layer may be connected to each other, and the secondary coil 114 of the first filter 110 and the secondary coil 124 of the second filter 120 formed on the fourth layer may be connected to each other.

The physical connection between the coils having the same order may be implemented by extending the outer end portions of the respective coils. For example, the primary coil 113 of the first filter 110 and the primary coil 123 of the second filter 120 may be connected to each other by a first connection conductor 133, as shown in FIG. 15, extended from the outer end portions of the respective coils. Likewise, the second coil 114 of the first filter 110 and the second coil 124 of the second filter 120 may be connected to each other by a second connection conductor 134, as shown in FIG. 17, extended from the outer end portions of the respective coils.

Figure 18:
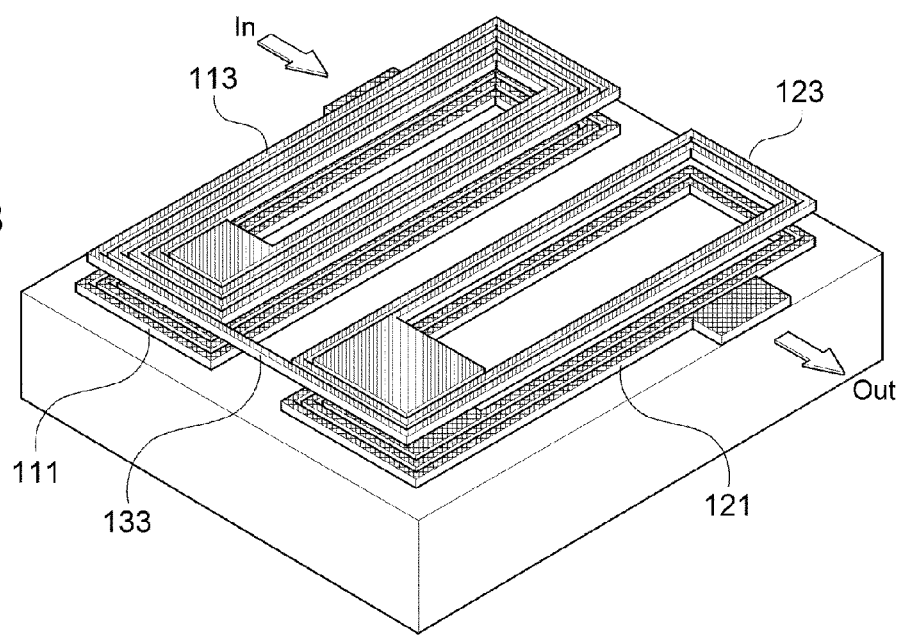
FIG. 18 is a perspective view illustrating only primary coils of first and third layers included in the present disclosure.

FIG. 18 is a view illustrating only the primary coils 111, 113, 121, and 123 formed on the first and third layers. Referring to FIG. 18, a signal to the primary coil may be externally output through an electrical path from the primary coil 111 of the first filter 110 to the primary coil 121 of the second filter 120 through the via 133a, the primary coil 113 of the first filter 110, the first connection pattern 133, the primary coil 123 of the second filter 120, and the via 133b.

Figure 19:
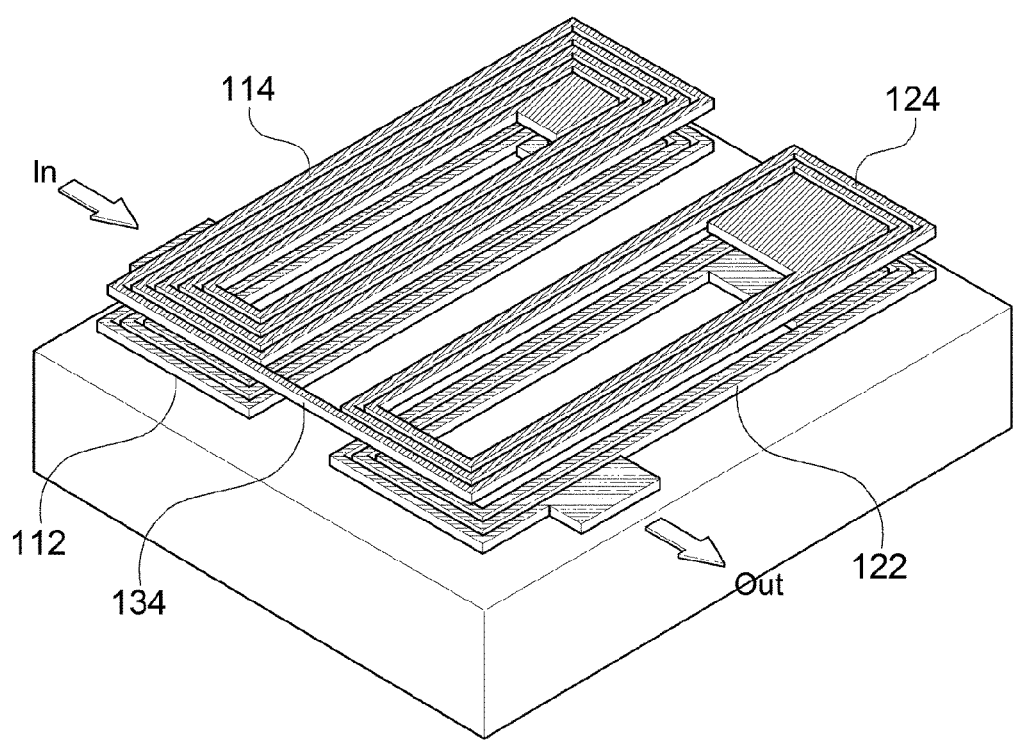
FIG. 19 is a perspective view illustrating only secondary coils of second and fourth layers included in the present disclosure.

FIG. 19 is a view illustrating only the secondary coils 112, 114, 122, and 124 formed on the second and fourth layers. Referring to FIG. 19, a signal to the secondary coil may be externally output through an electrical path from the secondary coil 112 of the first filter 110 to the secondary coil 122 of the second filter 120 through the via 134a, the secondary coil 114 of the first filter 110, the second connection pattern 134, the secondary coil 124 of the second filter 120, and the via 134b.

As such, according to the exemplary embodiment, the primary and secondary coils 111, 113, 121, 123, 112, 114, 122, and 124 of the respective filters are configured of the plurality of layers, and thus a variable range of the resonance frequency may be further increased by the number of coil turns. As a result, wideband noise may be further attenuated.

As set forth above, according to the exemplary embodiments, the common mode filter may have attenuation characteristics in the two different resonance frequency bands, and consequently, may remove common mode noise of a wide frequency band.

While exemplary embodiments have been shown and described above, it will be apparent to those skilled in the art that modifications and variations could be made without departing from the scope of the present invention as defined by the appended claims.

What is claimed is:

1. A common mode filter comprising:
a first filter and a second filter connected in series, each including: one or more primary coils and one or more secondary coils, wherein the one or more primary coils are alternately stacked with the one or more secondary coils, and are positioned to have magnetic coupling in a stacking direction;
wherein a resonance frequency of the first filter and a resonance frequency of the second filter are different from each other, and
a first distance in the stacking direction between adjacent coils of the one or more primary coils and the one or more secondary coils of the first filter is different from a second distance in the stacking direction between adjacent coils of the one or more primary coils and the one or more secondary coils of the second filter.

2. The common mode filter of claim 1, wherein the first filter and the second filter are disposed side by side.

3. The common mode filter of claim 1, wherein an inductance of the first filter is different from an inductance of the second filter.

4. The common mode filter of claim 1, wherein a capacitance of the first filter is different from a capacitance of the second filter.

5. The common mode filter of claim 1, wherein an inductance of the first filter is different from an inductance of the second filter, and a capacitance of the first filter is different from a capacitance of the second filter.

6. A common mode filter comprising:
a primary coil of a first filter and a primary coil of a second filter disposed side by side in a first direction and connected in series; and
a secondary coil of the first filter and a secondary coil of the second filter disposed side by side in the first direction, connected in series, and disposed to face the primary coils of the first and second filters in a second direction perpendicular to the first direction, respectively, wherein a first distance in the second direction between adjacent coils of the primary and the secondary coils of the first filter is different from a second distance in the second direction between adjacent coils of the primary and the secondary coils of the second filter;

wherein at least one of the following is met:

an inductance of the first filter is different from an inductance of the second filter, and a capacitance of the first filter is different from a capacitance of the second filter.

7. The common mode filter of claim 6, wherein a number of coil turns of the primary and secondary coils of the first filter is different from a number of coil turns of the primary and secondary coils of the second filter.

8. The common mode filter of claim 6, wherein the primary coil of the first filter, the secondary coil of the first filter, the primary coil of the second filter, and the secondary coil of the second filter are each respectively comprised of a plurality of coils that are in two or more layers and are connected through vias, and the primary coils are alternately disposed with the secondary coils in each filter.

9. The common mode filter of claim 8, wherein the primary coil of the first filter and the primary coil of the second filter are disposed on the same plane and are connected in series by a first connection pattern extended from outer end portions of the respective primary coils; and the secondary coil of the first filter and the secondary coil of the second filter are disposed on the same plane and are connected in series by a second connection pattern extended from outer end portions of the respective secondary coils.

10. The common mode filter of claim 6, further comprising:

a first input terminal connected to an outer end portion of the primary coil of the first filter and a first output terminal connected to an outer end portion of the primary coil of the second filter; and a second input terminal connected to an outer end portion of the secondary coil of the first filter and a second output terminal connected to an outer end portion of the secondary coil of the second filter.

11. The common mode filter of claim 6, further comprising:

a first connection conductor formed on a layer different from a layer containing the primary coils of the first and second filters and having an end portion connected to an inner end portion of the primary coil of the first filter through a first via and an end portion connected to an inner end portion of the primary coil of the second filter through a second via; and a second connection conductor foil led on a layer different from a layer containing the secondary coils of the first and second filters and having an end portion connected to an inner end portion of the secondary coil of the first filter through a third via and an end portion connected to an inner end portion of the secondary coil of the second filter through a fourth via.

12. The common mode filter of claim 11, further comprising:

an insulating layer enclosing the primary and secondary coils of the first and second filters, and the first and second connection conductors; and magnetic members formed on upper and lower portions of the insulating layer.

* * * * *